United States Patent [19]

Wilson et al.

[11] Patent Number: 5,440,643
[45] Date of Patent: Aug. 8, 1995

[54] AUDIO PERIPHERAL MIXER CIRCUIT AND METHOD FOR NOISE REDUCTION

[75] Inventors: David F. Wilson, Los Altos; Lawrence F. Heyl, Mtn. View, both of Calif.

[73] Assignee: Apple Computer, Inc., Cupertino, Calif.

[21] Appl. No.: 62,422

[22] Filed: May 13, 1993

[51] Int. Cl.⁶ .................. H04B 1/00; H04B 15/00; H03G 7/00
[52] U.S. Cl. ..................... 381/119; 381/94; 381/106
[58] Field of Search ............ 381/94, 119, 106, 56; 333/14

[56] References Cited

U.S. PATENT DOCUMENTS

| | | | |
|---|---|---|---|
| 3,992,584 | 11/1976 | Dugan | 381/119 |
| 4,357,492 | 11/1982 | Campbell et al. | 381/119 |
| 4,374,300 | 2/1983 | Ponto et al. | 381/119 |

Primary Examiner—Curtis Kuntz
Assistant Examiner—Sinh Tran
Attorney, Agent, or Firm—Charles E. Gotlieb; Amir H. Raubvogel

[57] ABSTRACT

A circuit and method for mixing signals from audio sources provide noise reduction by employing a noise gate to selectively attenuate one of the source signals. The noise gate has a low gain state and a unity gain state. The noise gate switches to its unity gain state when a control signal reaches a predefined threshold voltage. The control signal is generated by rectifying and integrating the noisy source audio signal, so that the noise gate enters the unity gain state only when a useful sound occurs. Thus, the noise in the combined audio signal is reduced, without attenuating useful components of the source signals.

8 Claims, 3 Drawing Sheets

AUDIO PERIPHERAL MIXER CIRCUIT AND METHOD FOR NOISE REDUCTION

BACKGROUND OF THE INVENTION

1. Field of the Invention

This invention relates to the field of audio signal processing circuitry, and, more particularly, to a circuit for mixing signals from audio sources that provides noise reduction.

2. Description of the Related Art

It is often desirable to mix audio signals from several different sources in order to produce a combined audio signal. In some situations, a source signal containing a relatively high level of noise may be combined with a source signal containing a relatively low level of noise. Such a combination of audio signals, when implemented according to known techniques, often results in relatively high noise levels at the output.

A typical situation is a combination of signals from a compact disc player, which has relatively low noise, with signals from a personal computer, which has relatively high noise. Such signals may be combined so that the computer can issue an "alert" sound, such as a beep, at a particular time while a user is listening to a compact disc. According to conventional signal combination techniques, the high levels of noise from the personal computer will be present in the combined signal, and may therefore be distracting or offensive to the user when he or she is listening to the compact disc.

SUMMARY OF THE INVENTION

In accordance with the present invention, there is provided a circuit for selectively attenuating one of multiple source audio signals. The attenuation of the audio signal is selective, so that no attenuation takes place when a desired sound, such as an "alert" sound, occurs. Thus, the noise in the combined audio signal is reduced, without attenuating useful components of the source signals.

The preferred embodiment of the present invention employs a noise gate having a low gain state and a unity gain state. The noise gate switches to its unity gain state when a control signal reaches a predefined threshold voltage. The control signal is generated by rectifying and integrating the noisy source audio signal, so that the noise gate enters the unity gain state only when a useful sound occurs.

BRIEF DESCRIPTION OF THE DRAWING

The drawing is a circuit diagram of the preferred embodiment.

DESCRIPTION OF THE PREFERRED EMBODIMENT

Figures 1, 1B:
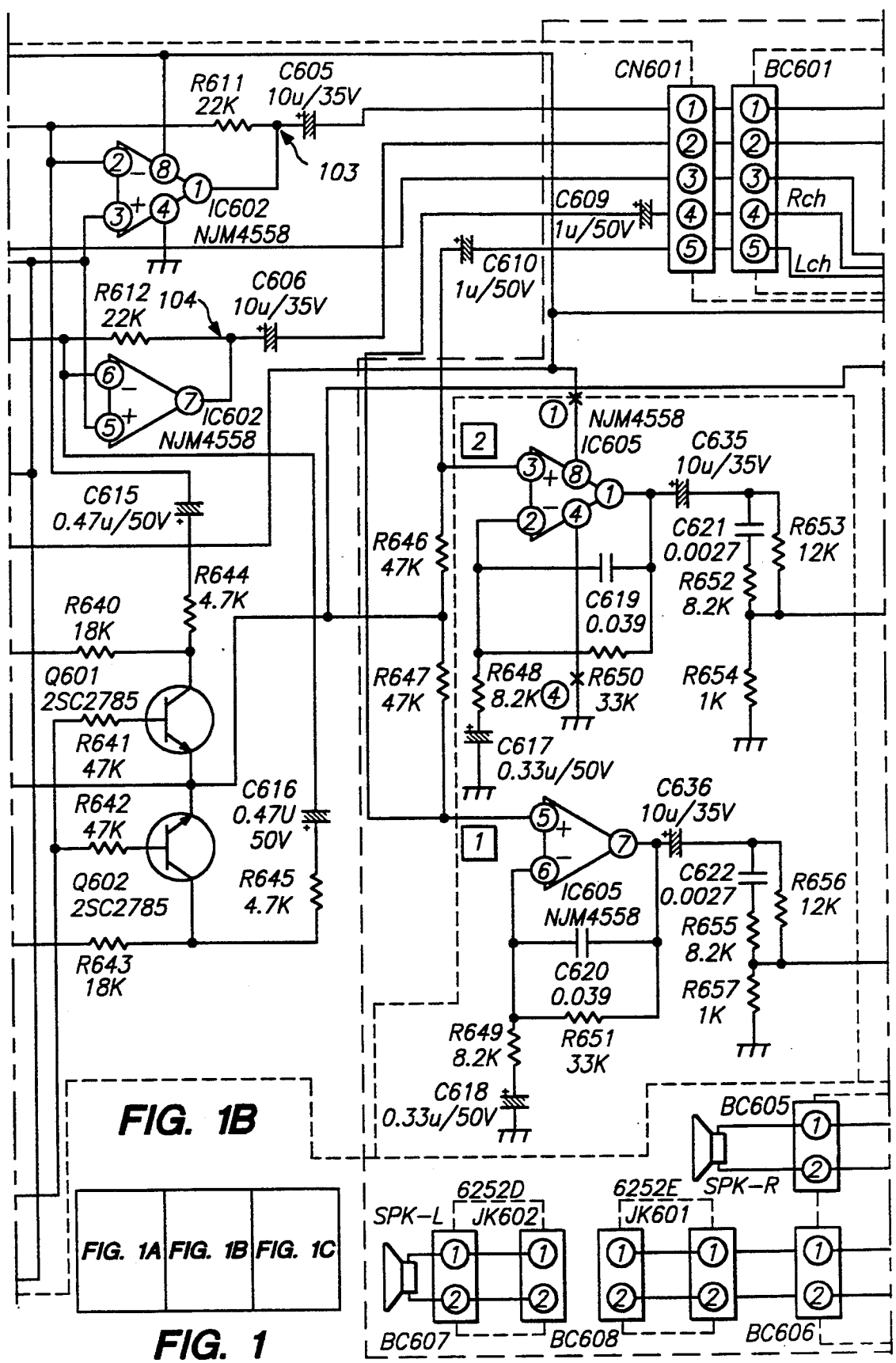
Figure 1A:
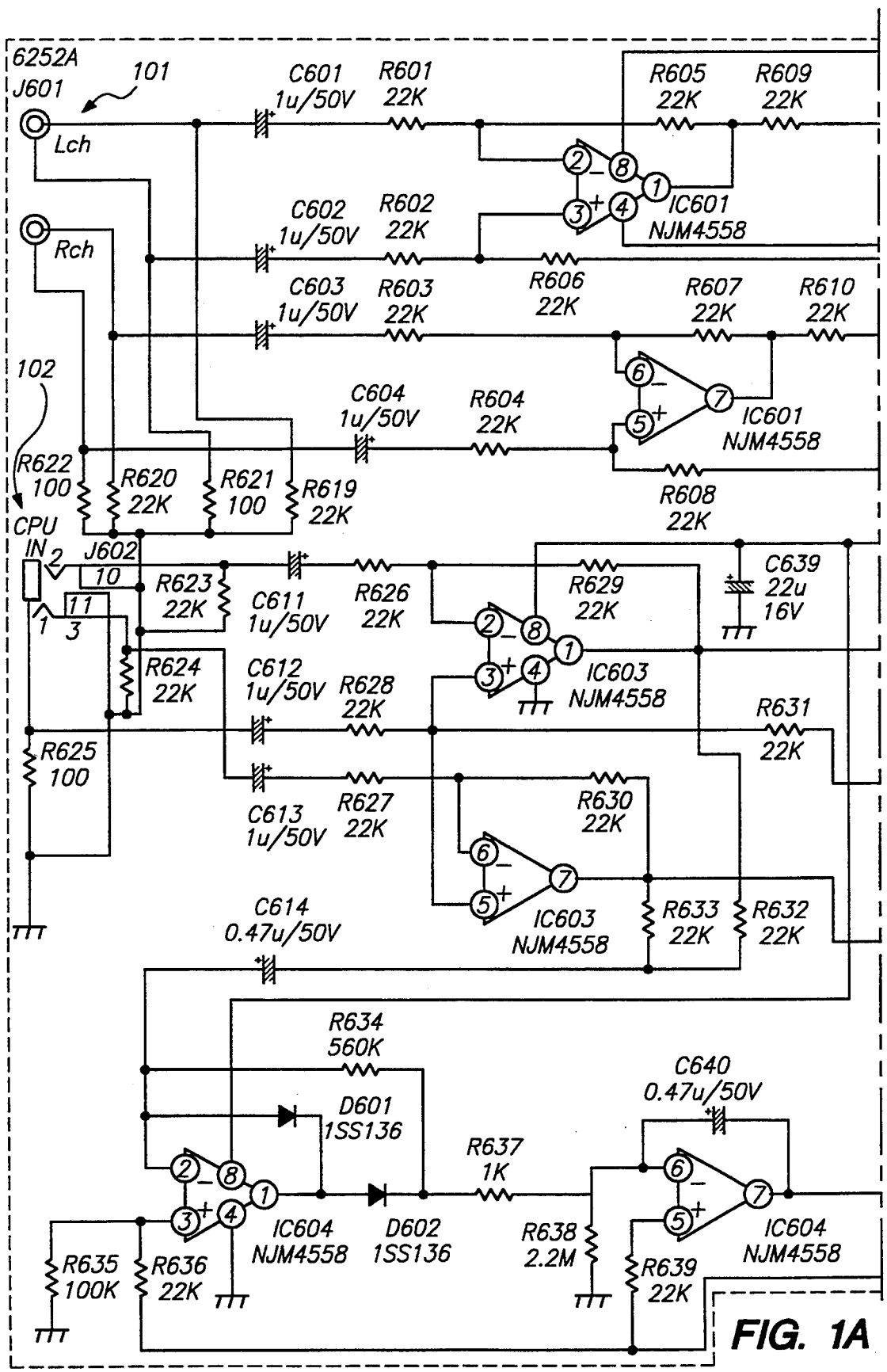
Figure 1C:
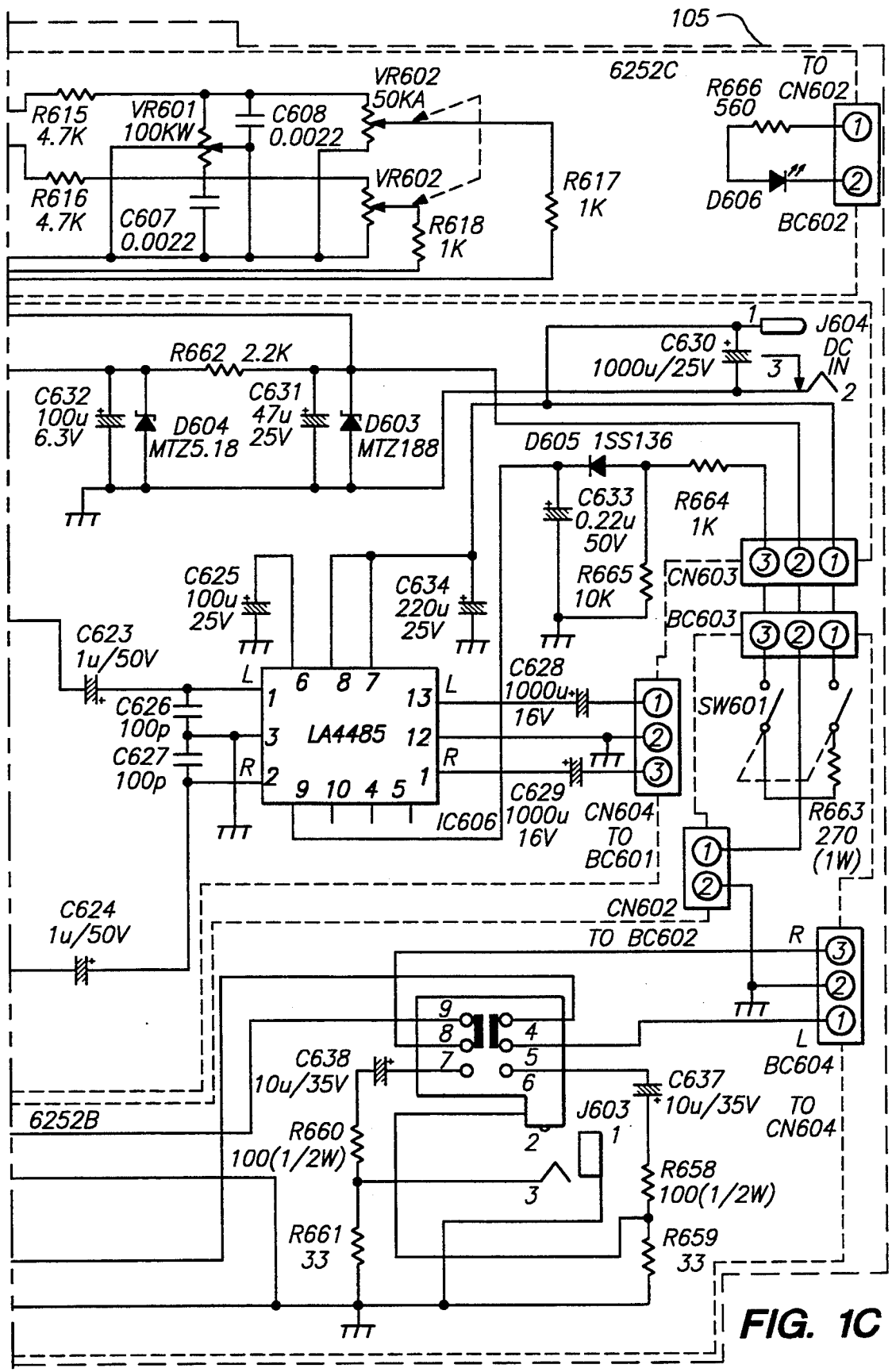

Referring now to the drawing, there is shown a circuit diagram depicting a preferred embodiment of the present invention. The preferred embodiment operates on two channels (typically left and right), although the invention may alternatively be practiced using a circuit that operates on only one channel, or on more than two channels. The two-channel configuration permits the use of dual amplifiers that are commonly available.

The circuit shown provides a mixing arrangement for two sets of source audio signals (or "channels"), each containing a left signal (L) and a right (R) signal, including a first (or AUX) signal set 101, typically coming from an audio device such as a CD player, and a second (or CPU) signal set 102, typically coming from a computer. The circuit provides noise reduction for the CPU signals only, since the CPU signals are more likely to contain relatively high noise levels as compared to the AUX signal set. However, the illustrated embodiment of the circuit could be modified to provide noise reduction on both sets of audio signals, if desired.

Dual operational amplifiers IC601 and IC603 are differential amplifiers connected in a pseudodifferential circuit to provide common mode rejection and isolation. Although such circuitry is not required to practice the present invention, it is employed in the preferred embodiment in order to reduce common mode noise. Alternatively, other forms of input conditioning circuitry could be used.

The outputs of amplifiers IC601 and IC603 represent buffered signals referred to a nominal +5 volt reference. In the illustrated circuit, this +5 volt reference is a signal reference developed in a conventional manner by diode D604, which eliminates the need for a separate negative power supply.

Dual operational amplifier IC602 functions as a mixing amplifier and operates according to well-known principles and techniques. Its left output 103 represents the algebraic sum of the left channel CPU audio signal and the left channel AUX audio signal, and its right output 104 represents the algebraic sum of the right channel CPU audio signal and the right channel AUX audio signal.

Transistors Q601 and Q602, controlled by operational amplifier IC604, form a "noise gate" to selectively attenuate the buffered CPU audio signals after they have passed through the common mode rejection circuit of IC603. The noise gate has two states: a low gain state in which the CPU audio signals are attenuated, and a unity gain state in which the CPU audio signals are not attenuated. Thus, the noise gate provides a mechanism by which source signals, such as those from personal computers, that typically contain high levels of background noise, may be selectively attenuated so that the background noise is not distracting or offensive to the computer user. When desired (typically when the computer emits a sound), the noise gate switches to its unity gain state so that the signal is reproduced at a useful volume. Noise that is present while the computer is emitting a desired sound is not usually offensive to the user, since the user's attention is focused on the desired sound.

The noise gate in this illustrated embodiment operates as follows. Two signal paths are provided: one for the audio signal, and another to develop a control signal to control the state of the noise gate. The audio signal path connects the differential amplifier outputs from IC603 to the inputs of mixing amplifier IC602. For the left channel, this path includes resistor R640, transistor Q601, resistor R644, and capacitor C615. For the right channel, this path includes resistor R643, transistor Q601, resistor R645, and capacitor C616. For purposes of illustration, the operation of the left channel will be described, although the right channel functions identically.

Transistor Q601 operates as a shunt switch, a switch which selectively shunts at least a portion of the signal at the collector of transistor Q601 to ground. In one embodiment, this is accomplished via the emitter of transistor Q601 and resistor R625. It may be implemented using a bipolar transistor as shown in the drawing, or another type of switching element such as a transconductance amplifier or field-effect transistor (FET). When the noise gate is in the low gain state, transistor Q601 is saturated. Thus, components R640, Q601, and R644 form a "tee" network with high attenuation (low gain). When the noise gate is in the unity gain state, transistor Q601 is cut off, so that the signal passes to mixing amplifier IC602 without attenuation. The gain of the buffered input signal is determined by the values of resistors R611, R640, and R644, by the equation:

$$\text{gain} = R611/(R640 + R644). \quad \text{(Eq. 1)}$$

In the preferred embodiment, the resistor values are chosen to result in a gain approximating unity:

$$\text{gain} = 22 \text{ k}\Omega/(18 \text{ k}\Omega + 4.7 \text{ k}\Omega) = 0.97 \quad \text{(Eq. 2)}$$

In practice, for the values indicated, the attenuation ratio of the illustrated circuit is approximately 36 dB.

The ratio R640/R644 is chosen to keep the audio signal on the collector of transistor Q601 to a few hundred millivolts so as to avoid offensive distortion of the audio signal when transistor Q601 is switching between states. Capacitor C615 is a DC-blocking capacitor, the value of which is chosen to attenuate a transient signal that creates an audible "thump" when transistor Q601 cuts off. The "thump" is caused by mixing amplifier IC602 amplifying the signal difference between collector and emitter of transistor Q601. Capacitor C615 blocks this current flow, and thereby attenuates the resulting audible "thump".

The control signal that controls the state of transistors Q601 and Q602 is generated as follows. Half of dual operational amplifier IC604, together with diodes D601 and D602, form a conventional precision half-wave rectifier. Resistors R633 and R632 algebraically sum the buffered inputs developed by the two halves of IC603 (representing the left and right channels of the audio signal). This algebraic sum is provided to the rectifier so that the noise gate state on both channels changes simultaneously. Capacitor C614 blocks DC offsets that could cause false triggering of the noise gate. The rectifier is biased by the voltage divider formed by resistors R636 and R635. The rectifier drives the other half of dual operational amplifier IC604, which, together with capacitor C640, form an integrator. When a small signal, such as background noise, is applied to the input, little signal is present at the cathode of diode D602. The DC level at this point is determined by the voltage divider formed by resistors R636 and R635. Because this DC level is lower than the voltage seen at the positive terminal of the second half of dual operational amplifier IC604 (pin 5), the integrator output ramps up to positive saturation.

When a larger signal, such as a meaningful sound, is applied to the input, the integrator output changes as follows. The threshold for triggering such change is determined by the voltage divider formed by resistors R636 and R635. When the input signal exceeds the threshold, the negative peaks of the signal are amplified by the precision rectifier with a gain determined by the ratio of resistors R634 and R632. In the circuit shown, gain is about R634/R632 = 560 k$\Omega$/22 k$\Omega$ = 25.5. The negative peaks thus become pulses that are applied to the integrator. If the large signal is applied for a sufficiently long duration, capacitor C640 is gradually discharged (in accordance with conventional operation of an integrator), the integrator comes out of positive saturation, and is eventually driven into negative saturation.

When the larger signal ceases, capacitor C640 becomes charged, and the integrator returns to positive saturation.

The integrator output forms the control signal used to control the noise gate. When the integrator is in positive saturation, it provides sufficient current to the bases of transistors Q601 and Q602 to keep the transistors in saturation, thus maintaining low gain (high attenuation) at the noise gate. When the integrator is in negative saturation, it pulls down the voltage at the bases of transistors Q601 and Q602 to a value below the emitter voltages. Thus, transistors Q601 and Q602 are cut off, and the noise gate enters its unity gain state.

As mentioned previously, the control signal is based on an algebraic sum of the two input channels, so as to avoid a situation where one channel of the noise gate is triggered before the other channel, resulting in unwanted stereo artifacts.

The attack time of the noise gate (from low gain to unity gain) depends on the time constant determined by the values of resistor R637 and capacitor C640, and the amount of input overdrive. This time constant for the circuit as shown is approximately 1 msec. The release time (from unity gain to low gain) depends on the time constant determined by the values of resistor R638 and capacitor C640. This time constant for the circuit as shown is approximately 1 sec. The selection of component values to provide a fast attack time and a slow release time is advantageous because it results in a circuit that trims as little as possible from the beginning of a sound, while allowing sounds to die away at the end without cutting them off or chattering.

In other embodiments of the invention, other input conditioning circuitry may be employed, or the circuit may be implemented for more than two input signals, or selective attenuation may be implemented for more than one of the input signals.

In the drawing, the circuit of the present invention is shown connected to conventional power supply and output circuitry 105.

Therefore, the invention provides a circuit for selectively attenuating a noisy audio signal to reduce noise, and combining the audio signal with another audio signal.

What is claimed is:

1. A circuit for mixing a first audio signal with a second audio signal, comprising:
   a control signal generator coupled to receive the first audio signal and having an output, the control signal generator generating at its output a control signal having a first state corresponding to the first audio signal not lower than a threshold value and a second state corresponding to the first audio signal lower than the threshold value;
   a selective attenuator coupled to receive the first audio signal and the control signal, the selective attenuator producing at its output an attenuated first audio signal to reduce noise in response to the control signal in the first state and a substantially unattenuated first audio signal in response to the control signal in the second state; and
   a mixing circuit coupled to receive the output signal from the selective attenuator and the second audio signal, the mixing circuit combining the selective attenuator output with the second audio signal, wherein the second audio signal is substantially unattenuated.

2. The circuit of claim 1, wherein:
the control signal has an attack time representing responsiveness to an increase in the amplitude of the first audio signal, and a decay time representing responsiveness to a decrease in the amplitude of the first audio signal; and
the attack time is of lesser duration than the decay time.

3. The circuit of claim 2, wherein:
the attack time is less than 100 msec; and
the decay time is greater than 100 msec.

4. The circuit of claim 1, wherein the selective attenuator includes a noise gate comprising a shunt switch selectively coupling the first audio signal through a resistive path to a ground.

5. The circuit of claim 4, wherein the control signal generator comprises:
a rectifier coupled to receive the first audio signal, for rectifying the first audio signal; and
an integrator coupled to the rectifier, for integrating the rectified signal to produce the control signal.

6. The circuit of claim 5, wherein the control signal generator further comprises a voltage divider coupled to the rectifier, for biasing the rectifier.

7. A circuit for providing selective attenuation of a first set of audio signals to reduce noise, the first set including a plurality of audio signals, and for mixing the selectively attenuated first set of audio signals with a second set of audio signals, the circuit comprising:

a summer for generating a sum signal representing an algebraic sum of the plurality of audio signals;
a rectifier coupled to receive the sum signal, for rectifying the sum signal;
a voltage divider coupled to the rectifier, for biasing the rectifier;
an integrator coupled to the rectifier, for integrating the rectified sum signal to produce a control signal;
a noise gate coupled to receive the first set of audio signals, for selectively attenuating the first set of audio signals responsive to the control signal; and
a mixing amplifier coupled to the noise gate and coupled to receive the second set of audio signals, for combining the selectively attenuated first set of audio signals with the second set of audio signals, wherein the second set of audio signals is substantially unattenuated.

8. A method of selectively attenuating a plurality of audio signals to reduce noise, and mixing the selectively attenuated plurality of audio signals with at least one substantially unattenuated audio signals, the method comprising the steps of:
generating a sum signal representing an algebraic sum of the plurality of audio signals; and
rectifying the sum signal;
integrating the rectified sum signal to produce a control signal indicating one of two states;
responsive to the control signal indicating a first of the two states, attenuating the plurality of audio signals; and
combining the selectively attenuated plurality of audio signals with at least one substantially unattenuated audio signal.

* * * * *